(12) United States Patent
Wu et al.

(10) Patent No.: US 11,817,054 B2
(45) Date of Patent: Nov. 14, 2023

(54) PIXEL STRUCTURE HAVING REPAIRING LIGHT EMITTING DIODE DIE AND EXTENDING CONDUCTOR AND DISPLAY HAVING PIXEL STRUCTURE

(71) Applicant: Industrial Technology Research Institute, Hsinchu (TW)

(72) Inventors: Ming-Hsien Wu, Hsinchu County (TW); Yao-Jun Tsai, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 17/879,793

(22) Filed: Aug. 3, 2022

(65) Prior Publication Data

US 2022/0375407 A1 Nov. 24, 2022

Related U.S. Application Data

(62) Division of application No. 16/892,313, filed on Jun. 4, 2020, now Pat. No. 11,443,692.

(30) Foreign Application Priority Data

Dec. 11, 2019 (TW) .................................. 108145271

(51) Int. Cl.
*G09G 3/3233* (2016.01)
*H01L 33/36* (2010.01)
(Continued)

(52) U.S. Cl.
CPC ........... *G09G 3/3233* (2013.01); *H01L 33/36* (2013.01); *H10K 50/805* (2023.02); *H10K 59/131* (2023.02); *G09G 2330/08* (2013.01)

(58) Field of Classification Search
CPC .. G09G 3/3233; G09G 2330/08; H01L 33/36; H01L 25/0753; H01L 2933/005;
(Continued)

(56) References Cited

U.S. PATENT DOCUMENTS

| | | | |
|---|---|---|---|
| 2003/0011377 A1* | 1/2003 | Oohata | H01L 24/24 324/512 |
| 2018/0175268 A1* | 6/2018 | Moon | H01L 27/15 |

(Continued)

*Primary Examiner* — Nduka E Ojeh
*Assistant Examiner* — Laura M Dykes
(74) *Attorney, Agent, or Firm* — JCIPRNET

(57) ABSTRACT

A pixel structure includes an original light emitting diode die and a repairing light emitting diode die emitting light of a same color, and an extending conductor. The original light emitting diode die includes a first epitaxial layer, and a first electrode and a second electrode disposed at opposite sides of the first epitaxial layer. The repairing light emitting diode die includes a second epitaxial layer, and a third electrode and a fourth electrode disposed at a same side of the second epitaxial layer. The extending conductor includes a first portion, a second portion and a cut-off region. The first portion is electrically connected to the second electrode of the original light emitting diode die. The second portion is electrically connected to the third electrode of the repairing light emitting diode die. The cut-off region is located in the first portion or between the first portion and the second portion.

11 Claims, 19 Drawing Sheets

(51) Int. Cl.
 *H10K 50/805* (2023.01)
 *H10K 59/131* (2023.01)
(58) Field of Classification Search
 CPC . H01L 25/0756; H01L 33/54; H01L 33/0095; H01L 27/156; H10K 50/805; H10K 59/131
 USPC .......................................................... 345/690
 See application file for complete search history.

(56) References Cited

U.S. PATENT DOCUMENTS

| | | | |
|---|---|---|---|
| 2020/0219779 A1* | 7/2020 | Yen | H01L 33/62 |
| 2020/0388601 A1* | 12/2020 | Liu | H01L 25/167 |
| 2021/0005796 A1* | 1/2021 | Min | H01L 24/73 |
| 2021/0043616 A1* | 2/2021 | Jung | H01L 24/83 |
| 2022/0320055 A1* | 10/2022 | Choi | H01L 25/0756 |

* cited by examiner

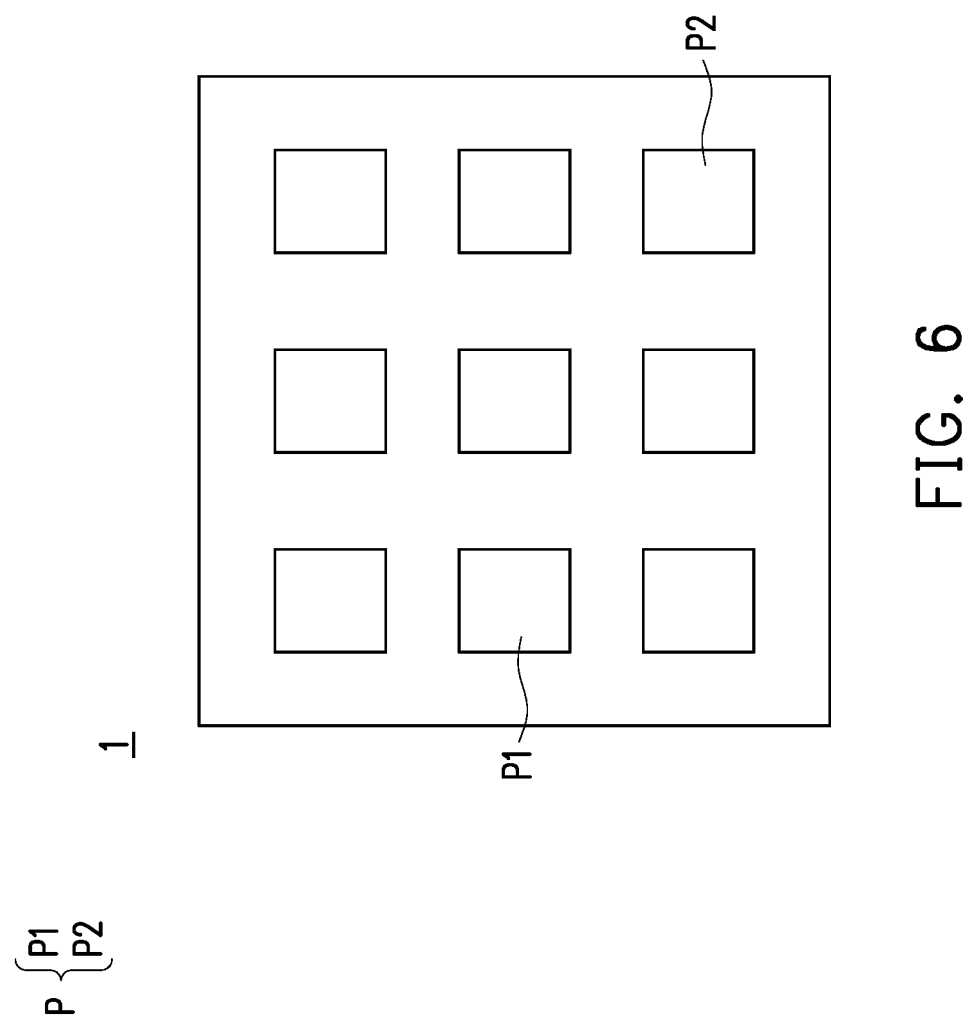

PIXEL STRUCTURE HAVING REPAIRING LIGHT EMITTING DIODE DIE AND EXTENDING CONDUCTOR AND DISPLAY HAVING PIXEL STRUCTURE

CROSS-REFERENCE TO RELATED APPLICATION

This application is a divisional application of and claims the priority benefit of U.S. application Ser. No. 16/892,313, filed on Jun. 4, 2020, now allowed, which claims the priority benefit of Taiwan application serial no. 108145271, filed on Dec. 11, 2019. The entirety of each of the above-mentioned patent applications is hereby incorporated by reference herein and made a part of this specification.

TECHNICAL FIELD

The technical field relates to a pixel structure and a manufacturing method thereof, and a display having the same, and in particular, to a pixel structure having light emitting diode dies and a manufacturing method thereof, and a display having the same.

BACKGROUND

With a same light emitting area, a vertical light emitting diode die may have a smaller die size than a horizontal light emitting diode die, which contributes to minimizing a pixel size in display applications, thus providing an improved display effect. However, it is difficult to detect and repair the vertical light emitting diode die. At present, a common method is to dispose 2 times (or more) of dies in each pixel in a die transfer stage to improve the overall pixel yield performance of a display. However, such a method needs to consume a larger number of light emitting diode dies, and there are concerns about the reliability.

SUMMARY

The disclosure provides a pixel structure and a manufacturing method thereof, and a display having the same. By use of the pixel structure and the manufacturing method thereof, defective pixels may be repaired in a simple and effective manner. Furthermore, the display having the pixel structure may still keep a desired display effect.

A pixel structure according to an embodiment includes an original light emitting diode die, a repairing light emitting diode die and an extending conductor. The original light emitting diode die includes a first epitaxial layer, a first electrode and a second electrode, and the first electrode and the second electrode are disposed at opposite sides of the first epitaxial layer. A color of light emitted by the repairing light emitting diode die is the same as a color of light emitted by the original light emitting diode die. The repairing light emitting diode die includes a second epitaxial layer, a third electrode and a fourth electrode, and the third electrode and the fourth electrode are disposed at a same side of the second epitaxial layer. The extending conductor has a first portion and a second portion. The first portion is electrically connected to the second electrode of the original light emitting diode die. The second portion is electrically connected to the third electrode of the repairing light emitting diode die. The extending conductor further has a cut-off region. The cut-off region is located in the first portion or between the first portion and the second portion.

A display according to an embodiment includes a plurality of pixel structures. The pixel structures are configured into an array. At least one of the pixel structures includes an original light emitting diode die, a repairing light emitting diode die and an extending conductor. The original light emitting diode die includes a first epitaxial layer, a first electrode and a second electrode, and the first electrode and the second electrode are disposed at opposite sides of the first epitaxial layer. A color of light emitted by the repairing light emitting diode die is the same as a color of light emitted by the original light emitting diode die. The repairing light emitting diode die includes a second epitaxial layer, a third electrode and a fourth electrode, and the third electrode and the fourth electrode are disposed at a same side of the second epitaxial layer. The extending conductor has a first portion and a second portion. The first portion is electrically connected to the second electrode of the original light emitting diode die. The second portion is electrically connected to the third electrode of the repairing light emitting diode die. The extending conductor further has a cut-off region. The cut-off region is located in the first portion or between the first portion and the second portion.

A manufacturing method of a pixel structure according to an embodiment includes the following steps: firstly, providing an original light emitting diode die, the original light emitting diode die including a first epitaxial layer, a first electrode and a second electrode, the first electrode and the second electrode are disposed at opposite sides of the first epitaxial layer, and the second electrode is at least partially exposed outside; then, forming an extending conductor, the extending conductor having a first portion and a second portion, and the first portion being electrically connected to the second electrode of the original light emitting diode die; then, detecting whether the original light emitting diode die is normal; and disposing a repairing light emitting diode die, and cutting off an electrical communication path of the first portion corresponding to the extending conductor if the original light emitting diode die is detected as abnormal. A color of light emitted by the repairing light emitting diode die is the same as a color of light emitted by the original light emitting diode die. The repairing light emitting diode die includes a second epitaxial layer, a third electrode and a fourth electrode, and the third electrode and the fourth electrode are disposed at a same side of the second epitaxial layer. The step of disposing the repairing light emitting diode die includes electrically connecting the third electrode of the repairing light emitting diode die to the second portion of the extending conductor.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 6 is a schematic diagram of an exemplary display.

DETAILED DESCRIPTION OF DISCLOSED EMBODIMENTS

Embodiments of the disclosure are described below in detail with reference to the accompanying drawings. It can be understood that the accompanying drawings are used for the purpose of description and explanation instead of limitation. For clarity, components may not be drawn to scale. In addition, some components and/or component symbols may be omitted in some drawings. In the specification and drawings, the same or similar component symbols are used to indicate the same or similar components. In the description of a component being "disposed in" or "connected to" another component, unless otherwise specified, the component may be "directly disposed in" or "directly connected to" another component, or there may be an intermediate component. It can be expected that elements and features in one embodiment may be incorporated into another embodiment and bring benefits if feasible, which is not further described.

Figure 1A:
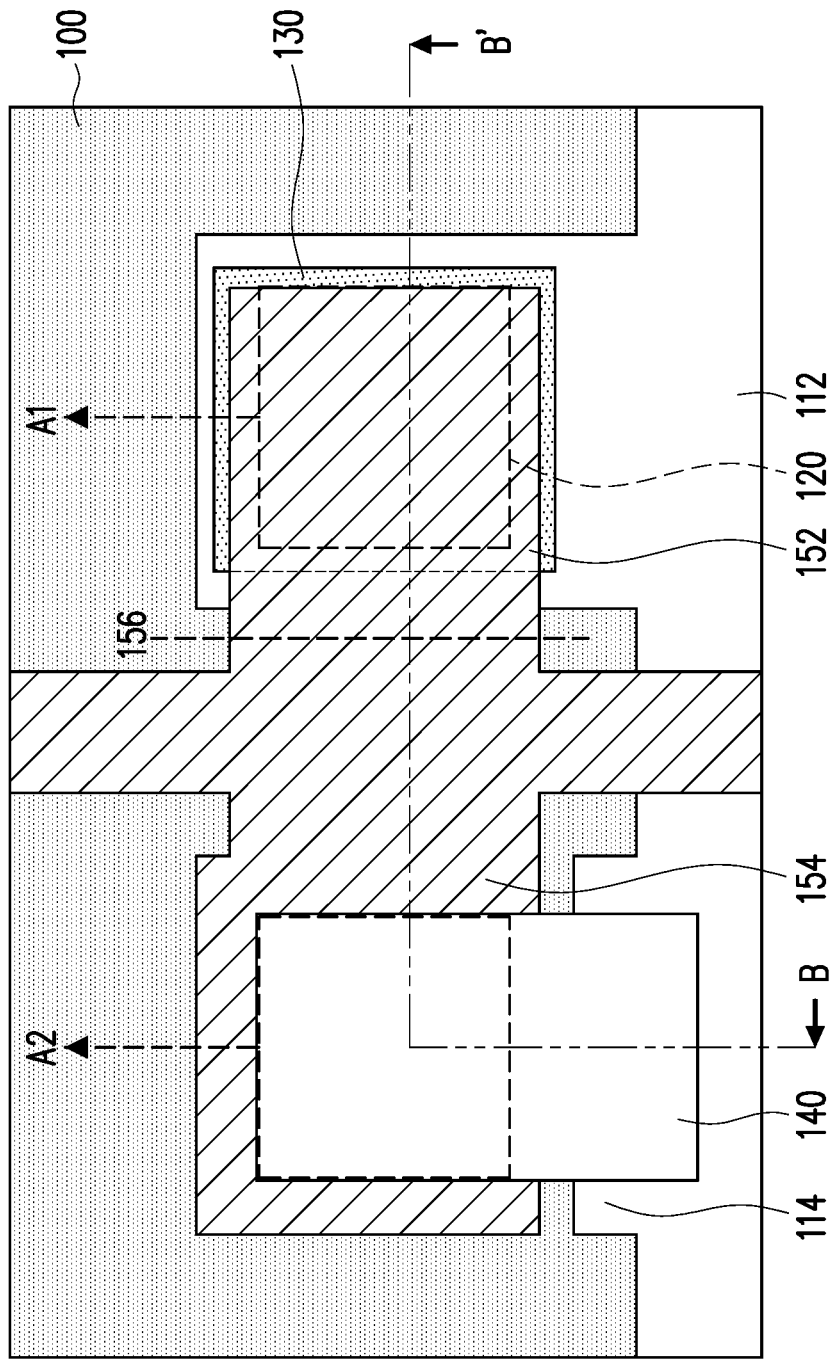
FIG. 1A to FIG. 1B are schematic diagrams of an exemplary pixel structure.
Figure 1B:
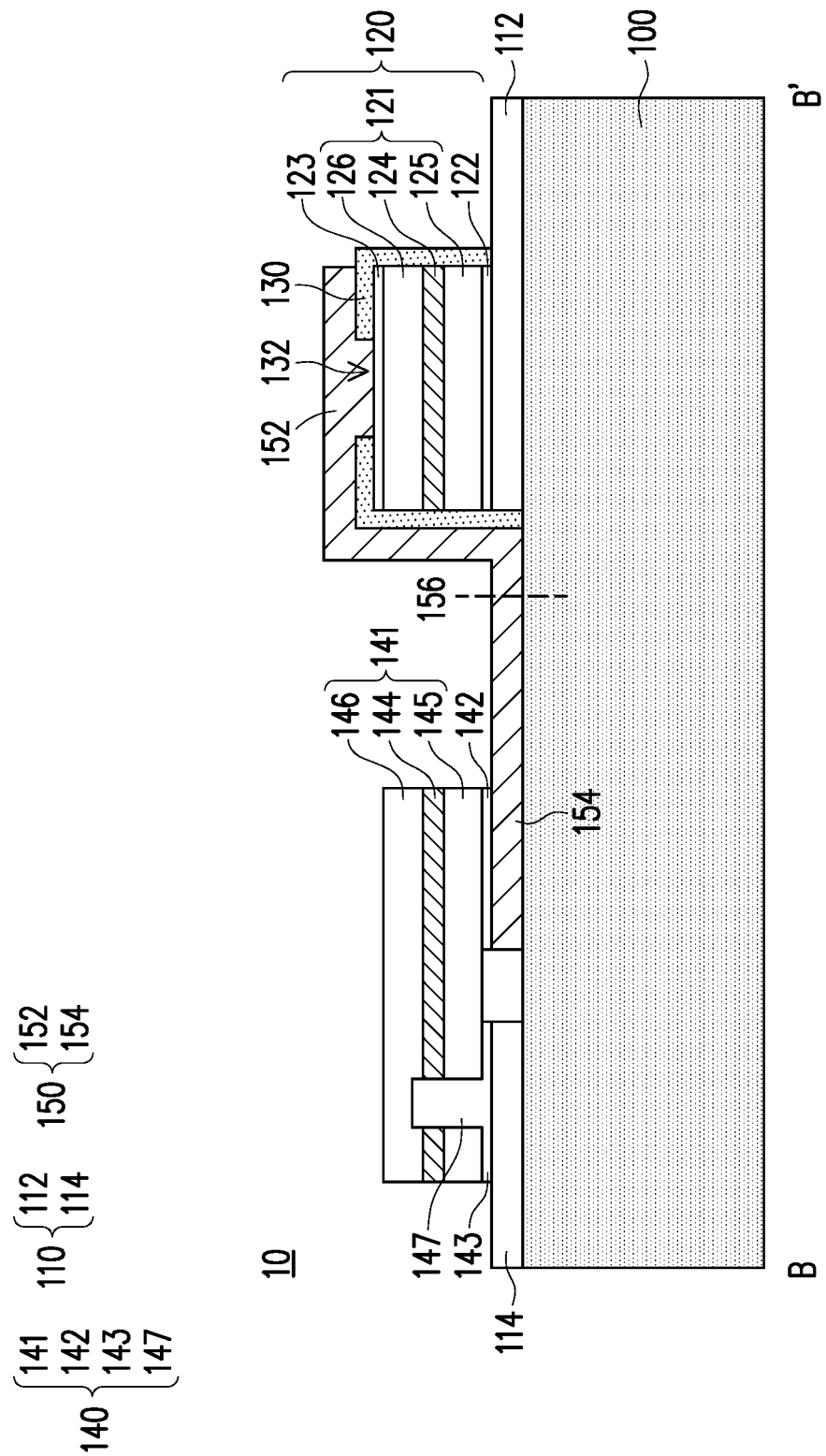

Referring to FIG. 1A to FIG. 1B, illustrating an exemplary pixel structure 10 according to an embodiment, FIG. 1A is a top view, and FIG. 1B is a cross-sectional view along a line B-B' in FIG. 1A. The pixel structure 10 includes an original light emitting diode die 120, a repairing light emitting diode die 140 and an extending conductor 150. The original light emitting diode die 120 includes a first epitaxial layer 121, a first electrode 122 and a second electrode 123, and the first electrode 122 and the second electrode 123 are disposed at opposite sides of the first epitaxial layer 121. The repairing light emitting diode die 140 includes a second epitaxial layer 141, a third electrode 142 and a fourth electrode 143, and the third electrode 142 and the fourth electrode 143 are disposed at a same side of the second epitaxial layer 141. The extending conductor 150 has a first portion 152 and a second portion 154. The first portion 152 is electrically connected to the second electrode 123 of the original light emitting diode die 120. The second portion 154 is electrically connected to the third electrode 142 of the repairing light emitting diode die 140. For the structure and method of the disclosure, one element/element portion may be, but not limited to, electrically connected to another element/element portion through direct contact.

More specifically, as shown in FIG. 1A to FIG. 1B, in some embodiments, the pixel structure 10 may further include a substrate 100, a patterned conductive layer 110 and a dielectric protective layer 130. The patterned conductive layer 110 is disposed on the substrate 100, and has a first pattern 112 and a second pattern 114. The original light emitting diode die 120 is disposed on the first pattern 112 of the patterned conductive layer 110 by the first electrode 122. The dielectric protective layer 130 covers the original light emitting diode die 120, and has an opening 132. The opening 132 exposes the second electrode 123. The extending conductor 150 is at least partially disposed on the dielectric protective layer 130. The first portion 152 of the extending conductor 150 is connected to the second electrode 123 of the original light emitting diode die 120 through the opening 132. The third electrode 142 of the repairing light emitting diode die 140 is disposed on the second portion 154 of the extending conductor 150. The fourth electrode 143 is electrically connected to the second pattern 114 of the patterned conductive layer 110.

The dielectric protective layer 130 of the pixel structure 10 is disposed on the original light emitting diode die 120. As shown in FIG. 1A to FIG. 1B, the dielectric protective layer 130 is disposed around the original light emitting diode die 120, so the extending conductor 150 of the pixel structure 10 is partially disposed on the dielectric protective layer 130, and further extends on the substrate 100. For example, the second portion 154 of the extending conductor 150 is disposed on the substrate 100, and the repairing light emitting diode die 140 may be disposed on the substrate 100 through the second portion 154 of the extending conductor 150 and the second pattern 114 of the patterned conductive layer 110. The extending conductor 150 is electrically insulated from a side wall of the original light emitting diode die 120 by the dielectric protective layer 130. The extending conductor 150 is electrically insulated from the first pattern 112 of the patterned conductive layer 110 by the dielectric protective layer 130.

The repairing of the light emitting diode die in the pixel structure 10 will now be described in more detail. The original light emitting diode die 120 in the embodiment is a vertical light emitting diode die. Specifically, the first epitaxial layer 121 may include a first light emitting layer 124, a first semiconductor layer 125 and a second semiconductor layer 126. The first semiconductor layer 125 has a first doping type, for example, an n-type. The second semiconductor layer 126 has a second doping type different from the first doping type, such as a p-type. The first semiconductor layer 125 and the second semiconductor layer 126 are located on opposite sides of the first light emitting layer 124 and are electrically connected to the first electrode 122 and the second electrode 123, respectively. The original light emitting diode die 120 has a light emitting region A1.

In the pixel structure 10, the repairing light emitting diode die 140 is configured because the original light emitting diode die 120 is detected as abnormal. The original light emitting diode die 120 may fail due to various reasons such as an open circuit or a short circuit. If the abnormality of the original light emitting diode die 120 is caused by a short circuit formed in its internal epitaxial layer, the circuit of the original light emitting diode die 120 needs to be cut off. For example, the extending conductor 150 may be cut off such that the extending conductor 150 has a cut-off region 156. The cut-off region 156 may be located on the first portion 152, but its position should be arranged so that the second electrode 123 does not maintain an electrical communication path through the remaining first portion 152. Or, as shown in FIG. 1A to FIG. 1B, the cut-off region 156 may be located between the first portion 152 and the second portion 154 such that the first portion 152 and the second portion 154 are separated from each other. The method of cutting off the extending conductor 150 is, for example, but not limited to, laser cutting. By the laser cutting method, a cutting trace caused by laser may be observed in the cut-off region 156 of the extending conductor 150. In other embodiments, the first electrode 122 of the original light emitting diode die 120 and the fourth electrode 143 of the repairing light emitting diode die 140 are connected to different bump contacts (such as the first pattern 112 and the second pattern 114 separated from each other), and it is also possible to cut off the circuit wiring of the first electrode 122 of the original light emitting diode die 120 to the corresponding bump contact. If the abnormality of the original light emitting diode die 120 is caused by an open circuit formed in its internal epitaxial layer, the original light emitting diode die 120 may be cut off selectively, for example, the cut-off region 156 is formed, or the connecting trace of the original light emitting diode die 120 may not be cut off.

The repairing light emitting diode die 140 is a horizontal light emitting diode die. Specifically, the second epitaxial layer 141 may include a second light emitting layer 144, a third semiconductor layer 145 and a fourth semiconductor layer 146. The third semiconductor layer 145 has a second doping type, for example, a p-type. The fourth semiconductor layer 146 has a first doping type, for example, an n-type. The third semiconductor layer 145 and the fourth semiconductor layer 146 are located on opposite sides of the second light emitting layer 144, and are electrically connected to the third electrode 142 and the fourth electrode 143, respectively. Specifically, the repairing light emitting diode die 140 may further include a hole 147. The hole 147 passes the fourth semiconductor layer 146, the second light emitting layer 144 and the third semiconductor layer 145, so that the fourth semiconductor layer 146 may be electrically connected to the fourth electrode 143 through the hole 147. The repairing light emitting diode die 140 has a light emitting region A2. According to some embodiments, the repairing light emitting diode die 140 may be selected, so that the light emitting region A2 of the repairing light emitting diode die 140 is the same as the light emitting region A1 of the original light emitting diode die 120. The light emitting regions A1 and A2 of the original light emitting diode die 120 and the repairing light emitting diode die 140 are the same, which may reduce or avoid the influence on a display effect of a display. In addition, the selected repairing light emitting diode die 140 emits the same color as that of the original light emitting diode die 120.

Referring to FIG. 2A to FIG. 2F, a manufacturing method of a pixel structure 10 according to an embodiment is illustrated. The manufacturing method includes the following steps. Firstly, an original light emitting diode die 120 is provided. The original light emitting diode die 120 includes a first epitaxial layer 121, a first electrode 122 and a second electrode 123, the first electrode 122 and the second electrode 123 are disposed at opposite sides of the first epitaxial layer 121, and the second electrode 123 is at least partially exposed outside. Then, an extending conductor 150 is formed. The extending conductor 150 has a first portion 152 and a second portion 154, and the first portion 152 is electrically connected to the second electrode 123 of the original light emitting diode die 120. Then, the original light emitting diode die 120 is detected to determine whether the original light emitting diode die 120 is normal. A repairing light emitting diode die 140 is disposed when the original light emitting diode die 120 is detected as abnormal. The repairing light emitting diode die 140 includes a second epitaxial layer 141, a third electrode 142 and a fourth electrode 143, and the third electrode 142 and the fourth electrode 143 are disposed at a same side of the second epitaxial layer 141. The step of disposing the repairing light emitting diode die 140 includes electrically connecting the third electrode 142 of the repairing light emitting diode die 140 to the second portion 154 of the extending conductor 150.

Figure 2A:
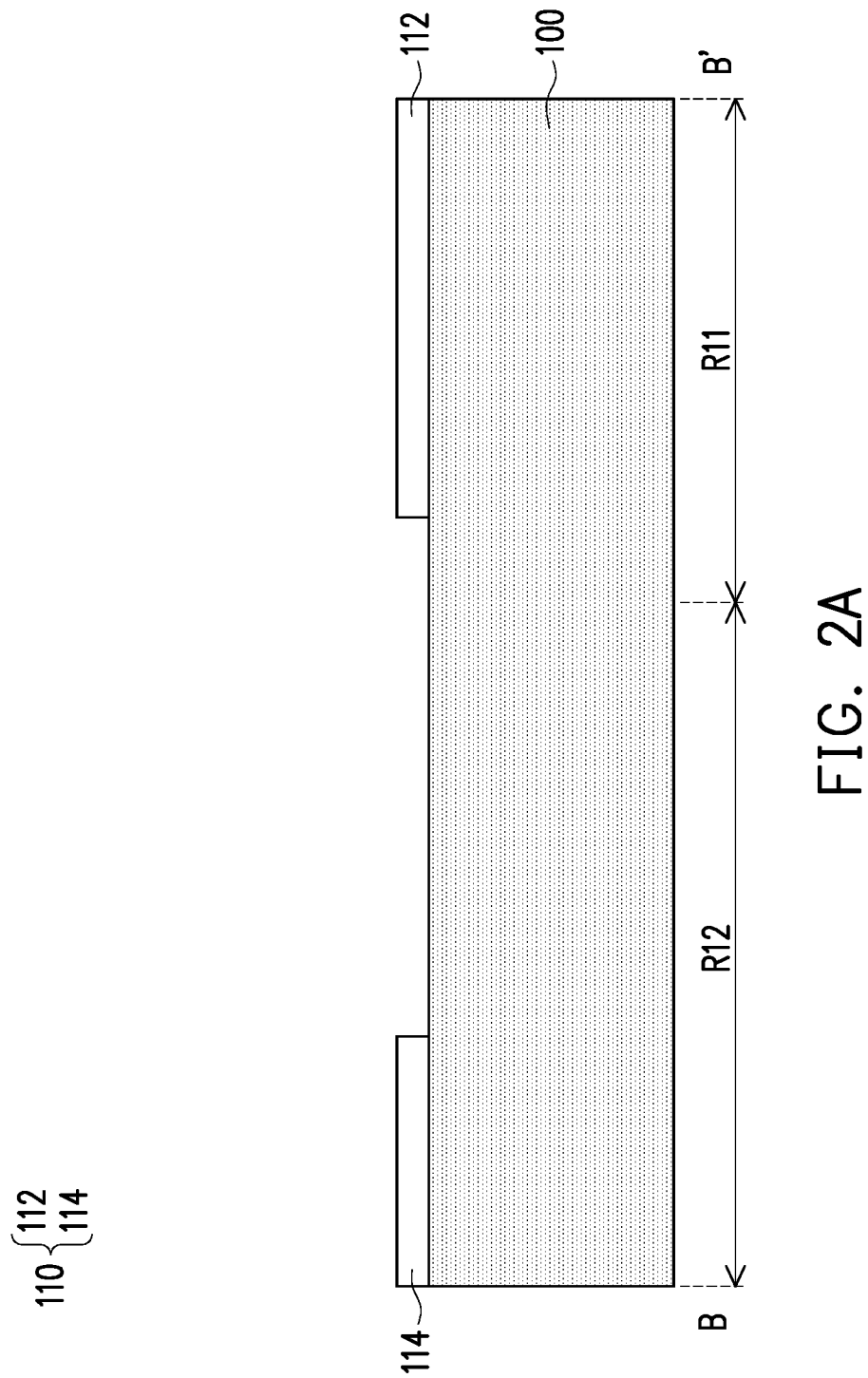
FIG. 2A to FIG. 2F are schematic diagrams of all stages of a manufacturing method of the pixel structure of FIG. 1A to FIG. 1B.

More specifically, as shown in FIG. 2A, a substrate 100 is provided. Then, a patterned conductive layer 110 is formed on the substrate 100. The patterned conductive layer 110 has a first pattern 112 and a second pattern 114. According to some embodiments, the substrate 100 may have an original die region R11 and a repairing die region R12. Since the repairing light emitting diode die 140 in the pixel structure 10 is disposed at a same height as the original light emitting diode die 120, the original die region RI 1 and the repairing die region R12 do not overlap. The first pattern 112 for the original light emitting diode die 120 is disposed in the original die region R11, and the second pattern 114 for the repairing light emitting diode die 140 is disposed in the repairing die region R12. The first pattern 112 and the second pattern 114 may be configured as same bump contacts or different bump contacts.

Figure 2B:
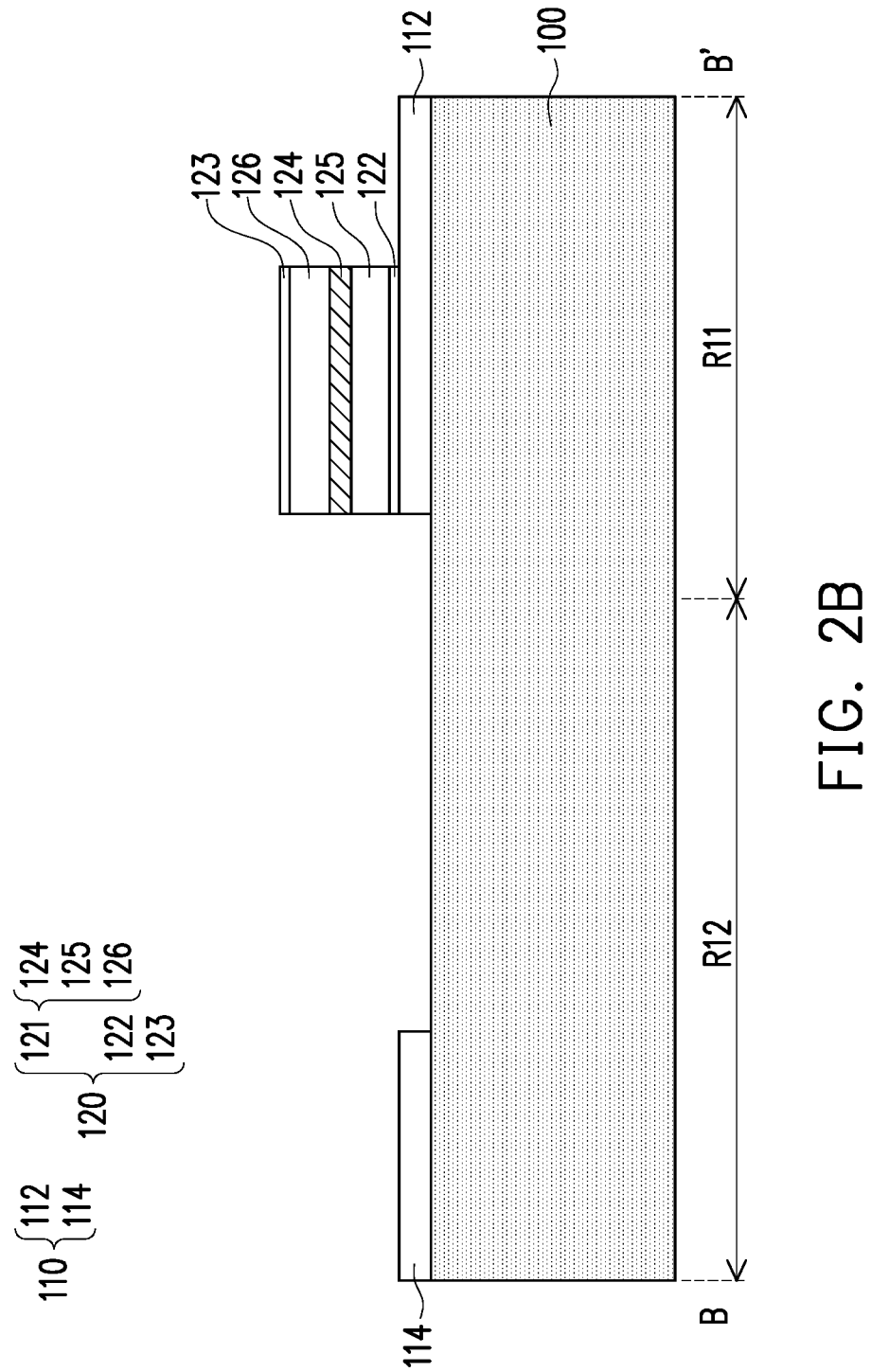

As shown in FIG. 2B, the original light emitting diode die 120 is provided, and the original light emitting diode die 120 is disposed on the first pattern 112 of the patterned conductive layer 110 by the first electrode 122. For example, the original light emitting diode die 120 may be transferred from its manufacturing substrate to the substrate 100 by a transfer technology, but it is not limited thereto. Details of the original light emitting diode die 120 are as described above and shall not be repeatedly described herein.

Figure 2C:
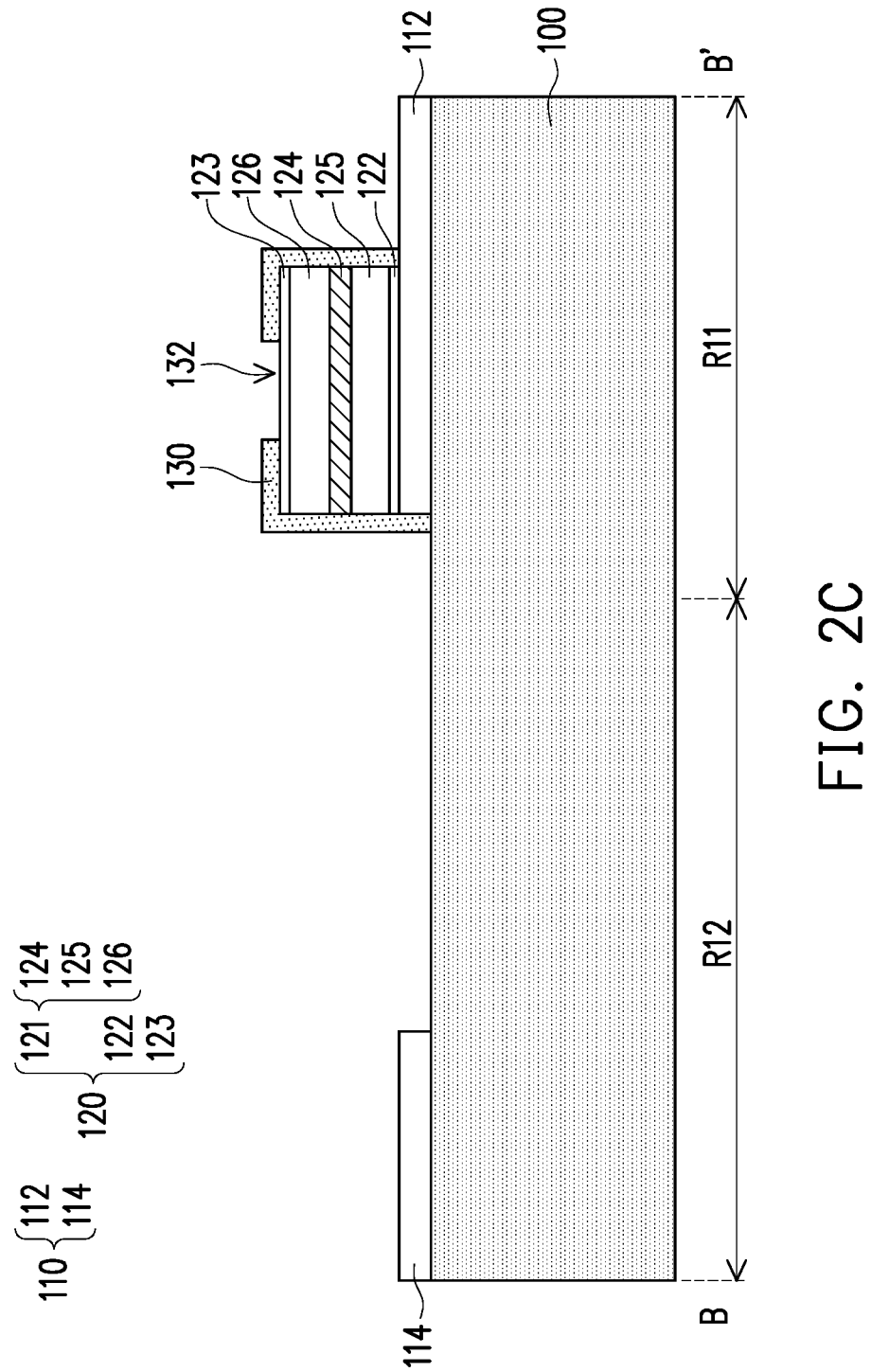

As shown in FIG. 2C, a dielectric protective layer 130 is formed to cover the original light emitting diode die 120. The dielectric protective layer 130 has an opening 132 to expose the second electrode 123.

Figure 2D:
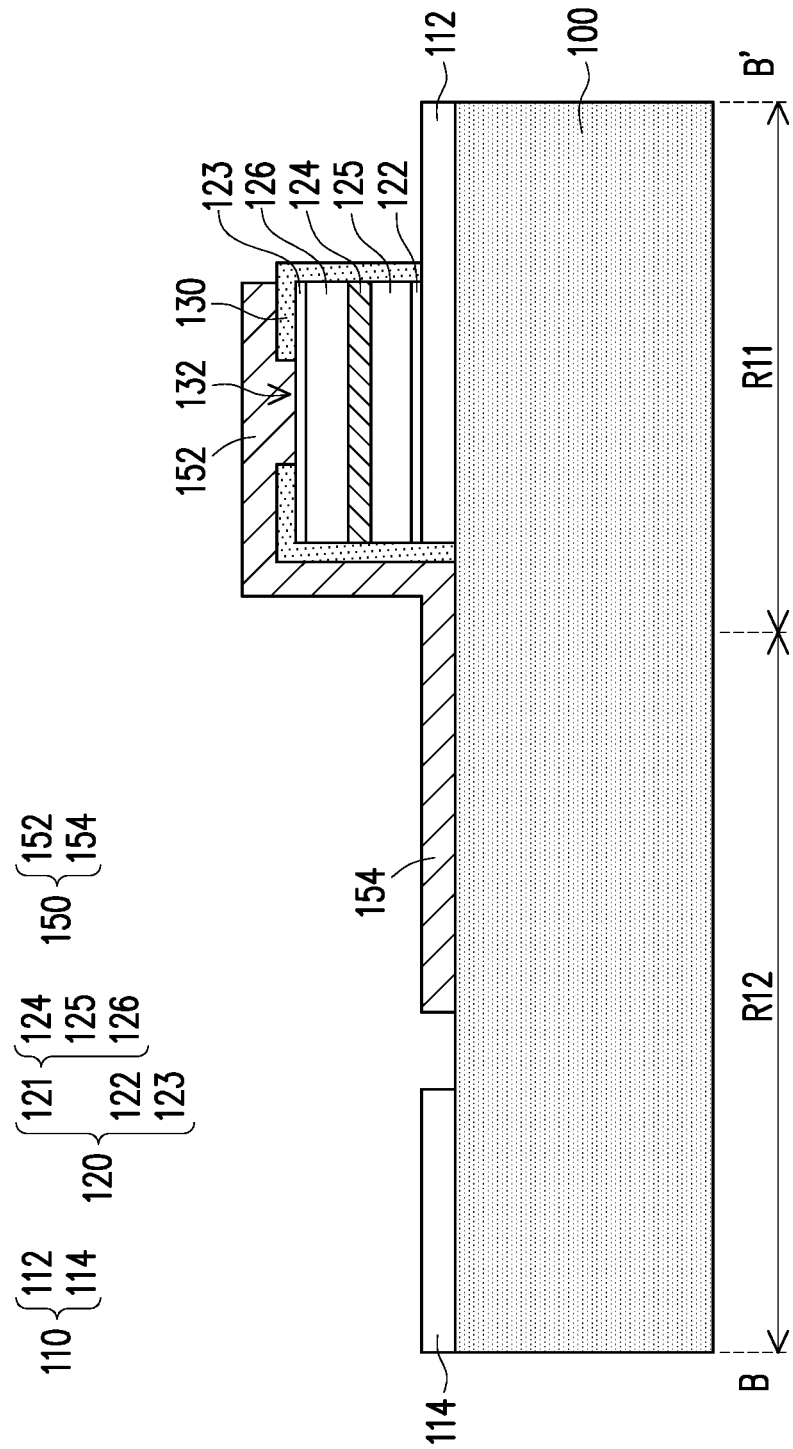

Next, as shown in FIG. 2D, the extending conductor 150 is formed. The extending conductor 150 extends from the dielectric protective layer 130 located in the original die region R11 to the repairing die region R12. The extending conductor 150 has a first portion 152 and a second portion 154. The first portion 152 is electrically connected to the second electrode 123 of the original light emitting diode die 120, for example, it is in direct contact with the second electrode 123 or is electrically connected to the second electrode 123 through solder. The second portion 154 is formed on the substrate 100. In some embodiments, the extending conductor 150 belongs to a second patterned conductive layer.

Figure 2E:
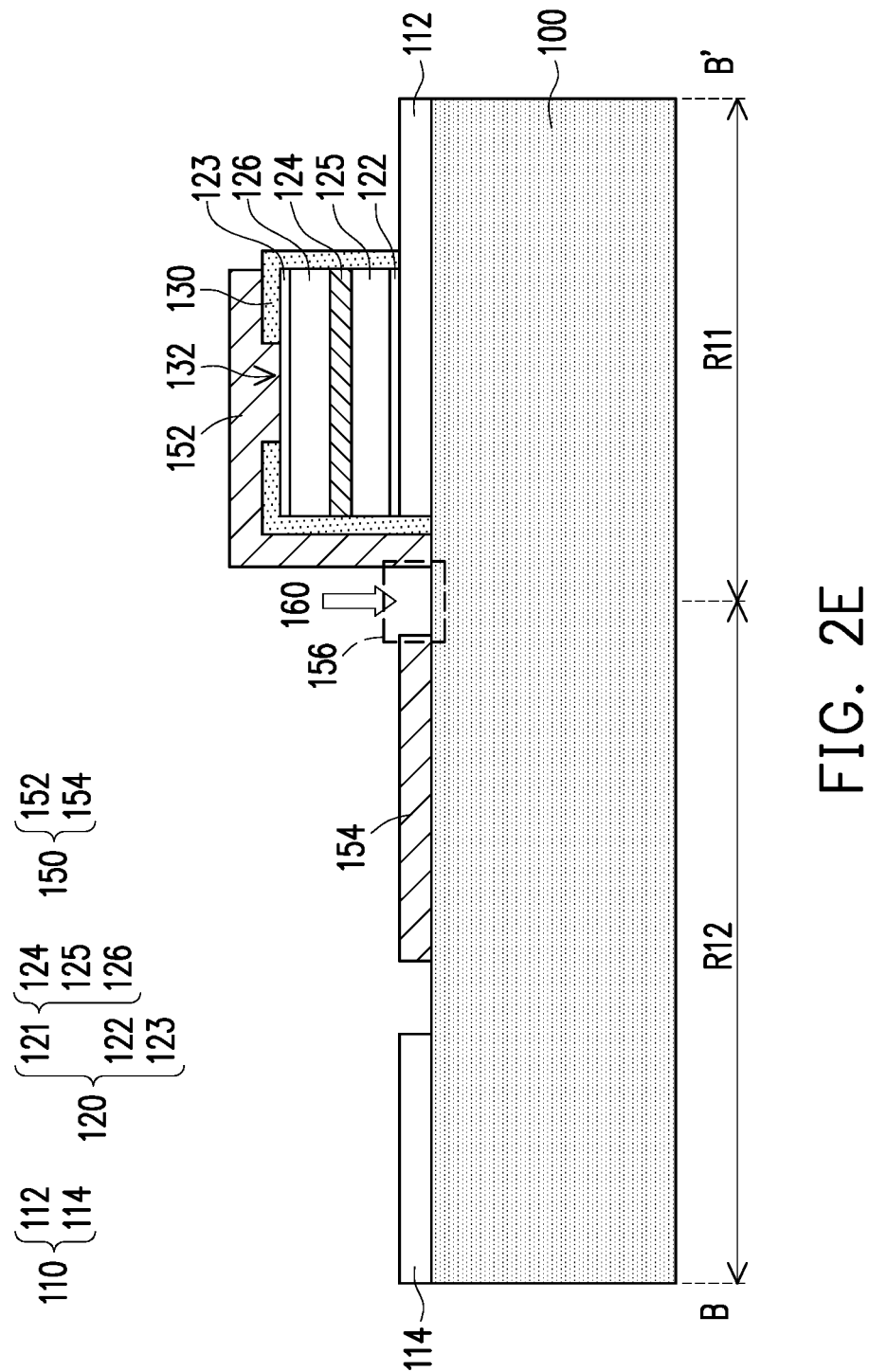

The first portion 152 of the extending conductor 150 is electrically connected to the second electrode 123 of the original light emitting diode die 120. Therefore, after the extending conductor 150 is formed, the original light emitting diode die 120 may be detected, for example, by the first pattern 112 of the patterned conductive layer 110 and the extending conductor 150. Since it is not necessary to directly contact the original light emitting diode die 120, negative effects on the original light emitting diode die 120 resulting from probe contact or the like in the detection process can be avoided. As shown in FIG. 2E, if the original light emitting diode die 120 is detected as abnormal, an electrical communication path of the first portion 152 corresponding to the extending conductor 150 may be cut off selectively. In FIG. 2E, the first portion 152 and the second portion 154 of the extending conductor 150 are cut off. For example, laser cutting 160 may be performed. In this case, the cut-off region 156 of the extending conductor 150 may be burnt or have other marks due to the laser cutting.

Figure 2F:
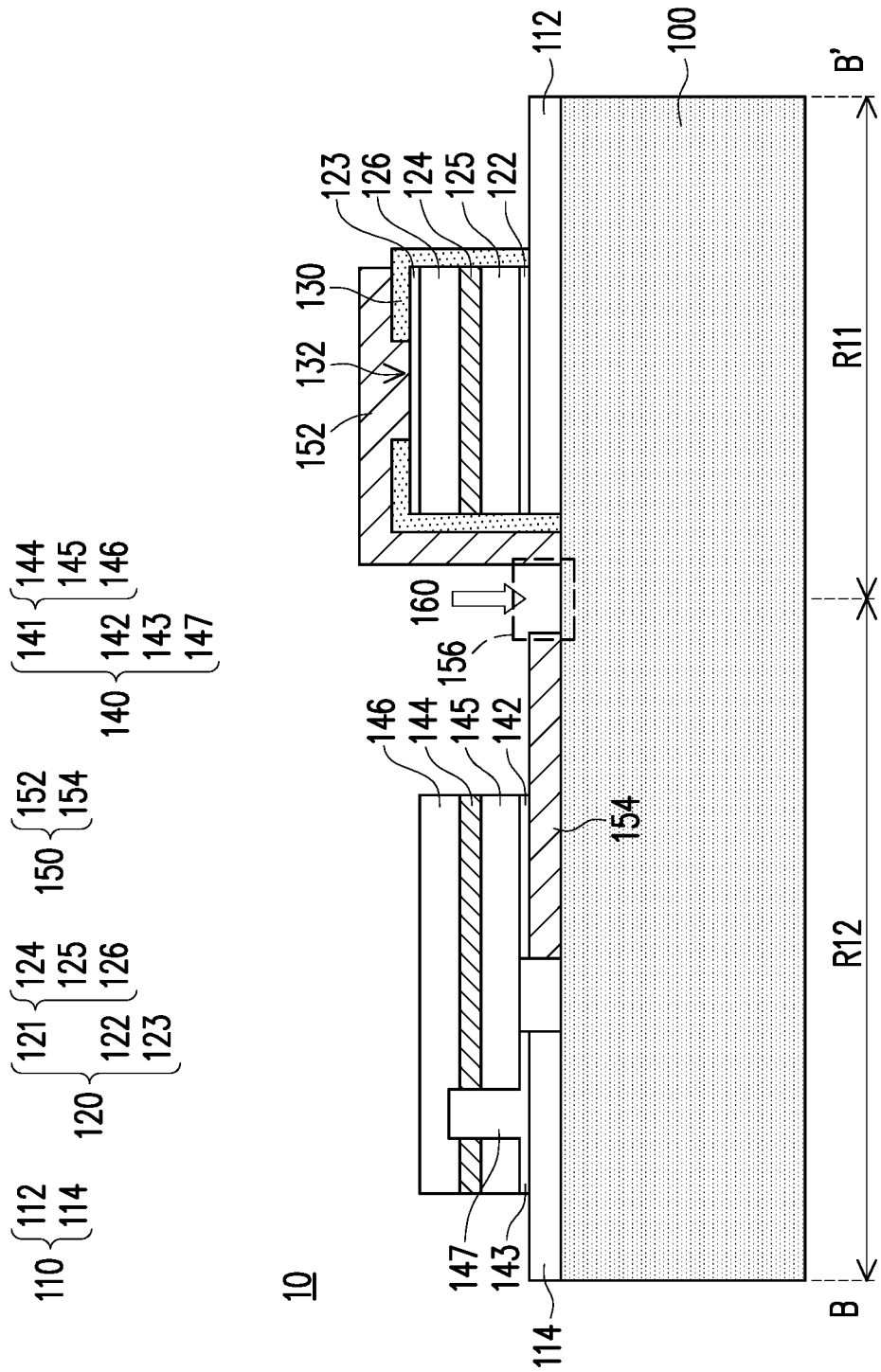

As shown in FIG. 2F, if the original light emitting diode die 120 is detected as abnormal, the repairing light emitting diode die 140 is disposed. According to some embodiments, the third electrode 142 of the repairing light emitting diode die 140 may be disposed on the second portion 154 of the extending conductor 150, and the fourth electrode 143 is disposed on the second pattern 114 of the patterned conductive layer 110. In this way, the third electrode 142 is electrically connected to the second portion 154 of the extending conductor 150, and the fourth electrode 143 is electrically connected to the second pattern 114 of the patterned conductive layer 110, so that the repairing light emitting diode die 140 may be further electrically connected to the outside.

By the adoption of the pixel structure 10 and the manufacturing method thereof according to the embodiments, when a conductor (the first portion 152 of the extending conductor 150) for external connection of the second electrode 123 of the original light emitting diode die 120 is formed, a conductor (the second portion 154 of the extending conductor 150) for external connection of the third electrode 142 of the repairing light emitting diode die 140 is also formed. Therefore, it is not necessary to use an additional process to provide the conductor for the external connection of the repairing light emitting diode die 140, and the process required for disposing the repairing light emitting diode die 140 can be simplified. In addition, as described in the embodiment, the horizontal repairing light emitting diode die 140 is used to further avoid an additional process that is possibly required by a vertical light emitting diode die for repairing. In addition, the repairing light emitting diode die 140 having the light emitting region A2 which is the same as the light emitting region A1 of the original light emitting diode die 120 may be selected, so as to reduce or avoid the influence on the display effect of the display.

Figure 3A:
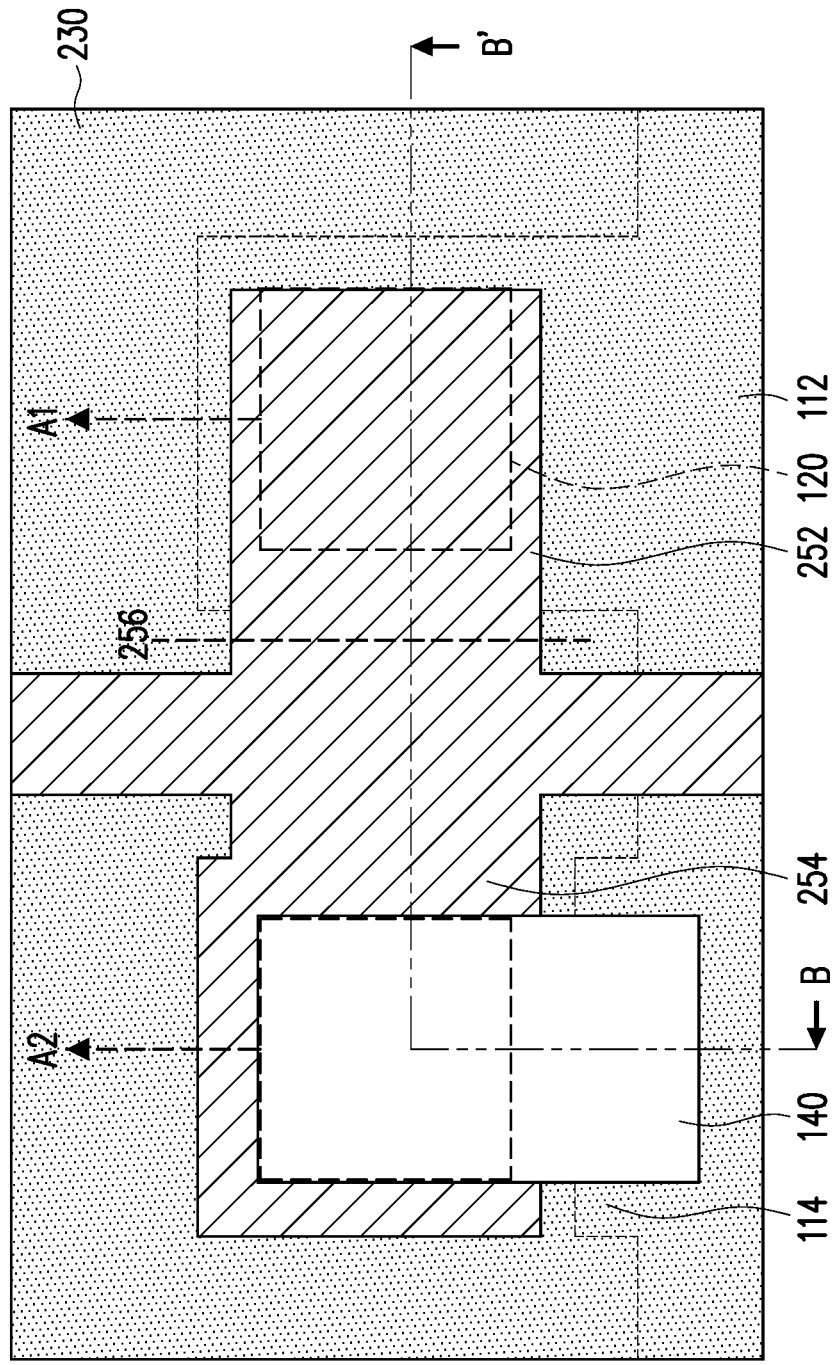
FIG. 3A to FIG. 3B are schematic diagrams of another exemplary pixel structure.
Figure 3B:
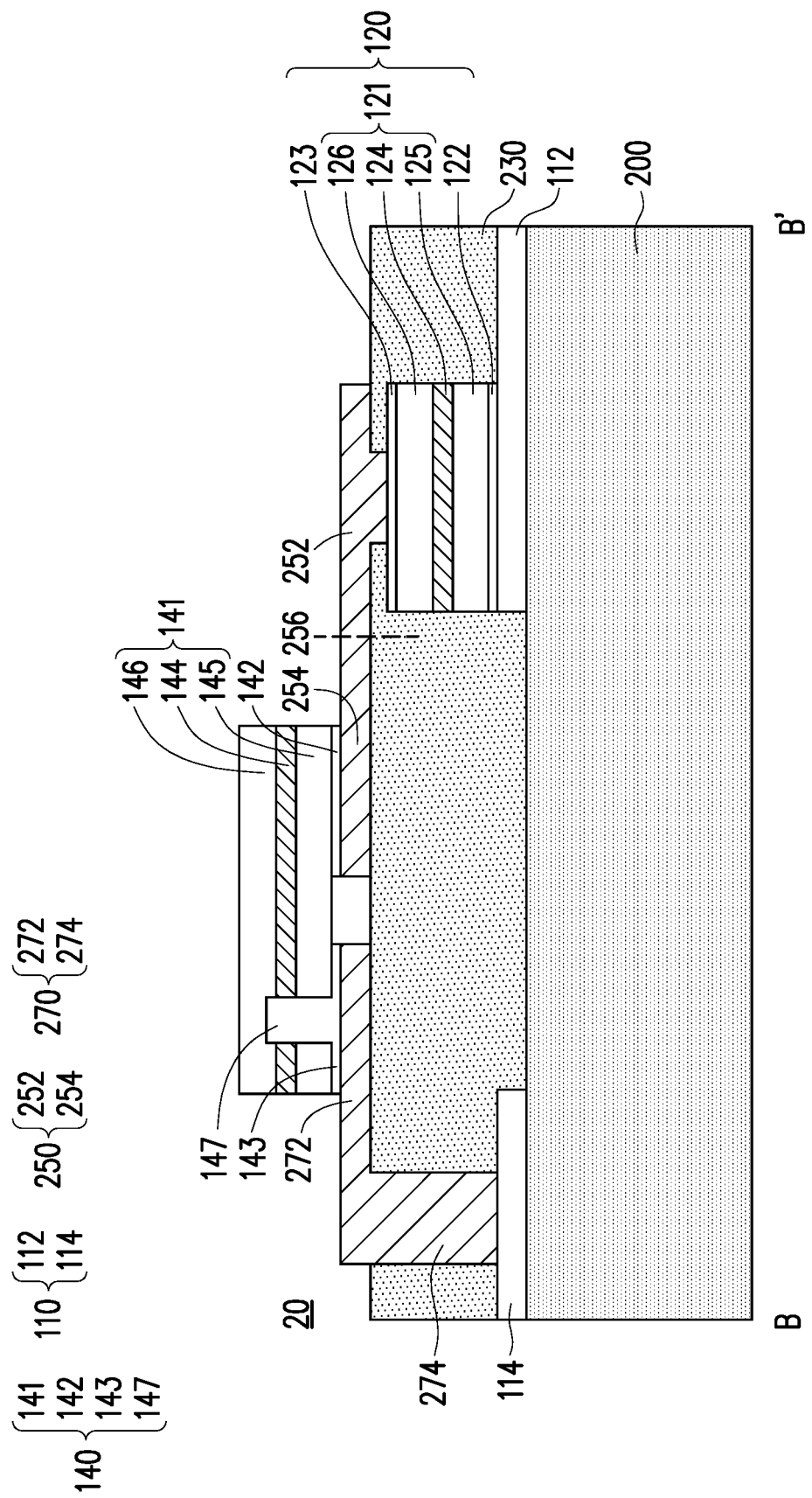

Now referring to FIG. 3A to FIG. 3B, illustrating an exemplary pixel structure 20 according to another embodiment, FIG. 3A is a top view, and FIG. 3B is a cross-sectional view along a line B-B' in FIG. 3A. The pixel structure 20 is different from the pixel structure 10 in the coverage of the dielectric protective layer 230 and the structural difference caused therefrom. The dielectric protective layer 230 extends on a substrate 200 and covers the substrate 200, a patterned conductive layer 110 and an original light emitting diode die 120. In this regard, according to some embodiments, a second portion 254 of an extending conductor 250 is horizontally disposed on a dielectric protective layer 230, and the pixel structure 20 further includes a bonding conductor 270. The bonding conductor 270 has a wiring portion 272 and a hole portion 274. The wiring portion 272 is disposed on the dielectric protective layer 230. The hole portion 274 passes through the dielectric protective layer 230, and is connected to a second pattern 114 of the patterned conductive layer 110. A repairing light emitting diode die 140 is disposed on the dielectric protective layer 230 through the second portion 254 of the extending conductor 250 and the wiring portion 272 of the bonding conductor 270. A thickness of the dielectric protective layer 230 is greater than that of the original light emitting diode die 120. Therefore, a top surface of the dielectric protective layer 230 is higher than that of the original light emitting diode die 120. In addition, the repairing light emitting diode die 140 is located on the top surface of the dielectric protective layer 230. Therefore, the repairing light emitting diode die 140 is higher than the original light emitting diode die 120. Other features, details and advantages of the pixel structure 20 are the same as those of the pixel structure 10, and descriptions thereof are omitted here.

Referring to FIG. 4A to FIG. 4F, a manufacturing method of the pixel structure 20 according to an embodiment is illustrated. Features, details and advantages in the manufacturing method of the pixel structure 20, which are the same as those in the manufacturing method of the pixel structure 10 in FIG. 2A to FIG. 2F, are omitted here.

Figure 4A:
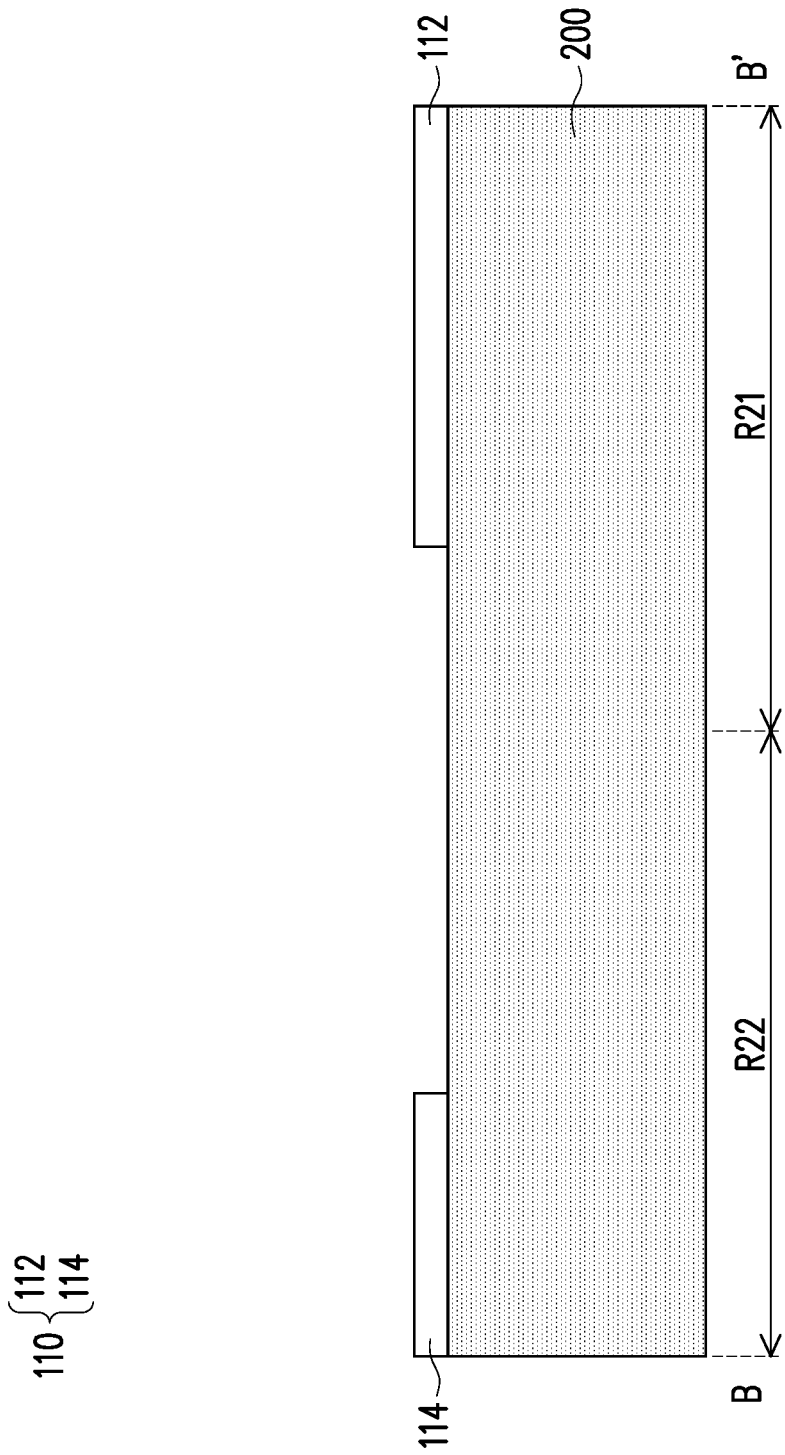
FIG. 4A to FIG. 4F are schematic diagrams of all stages of a manufacturing method of the pixel structure of FIG. 3A to FIG. 3B.
Figure 4B:
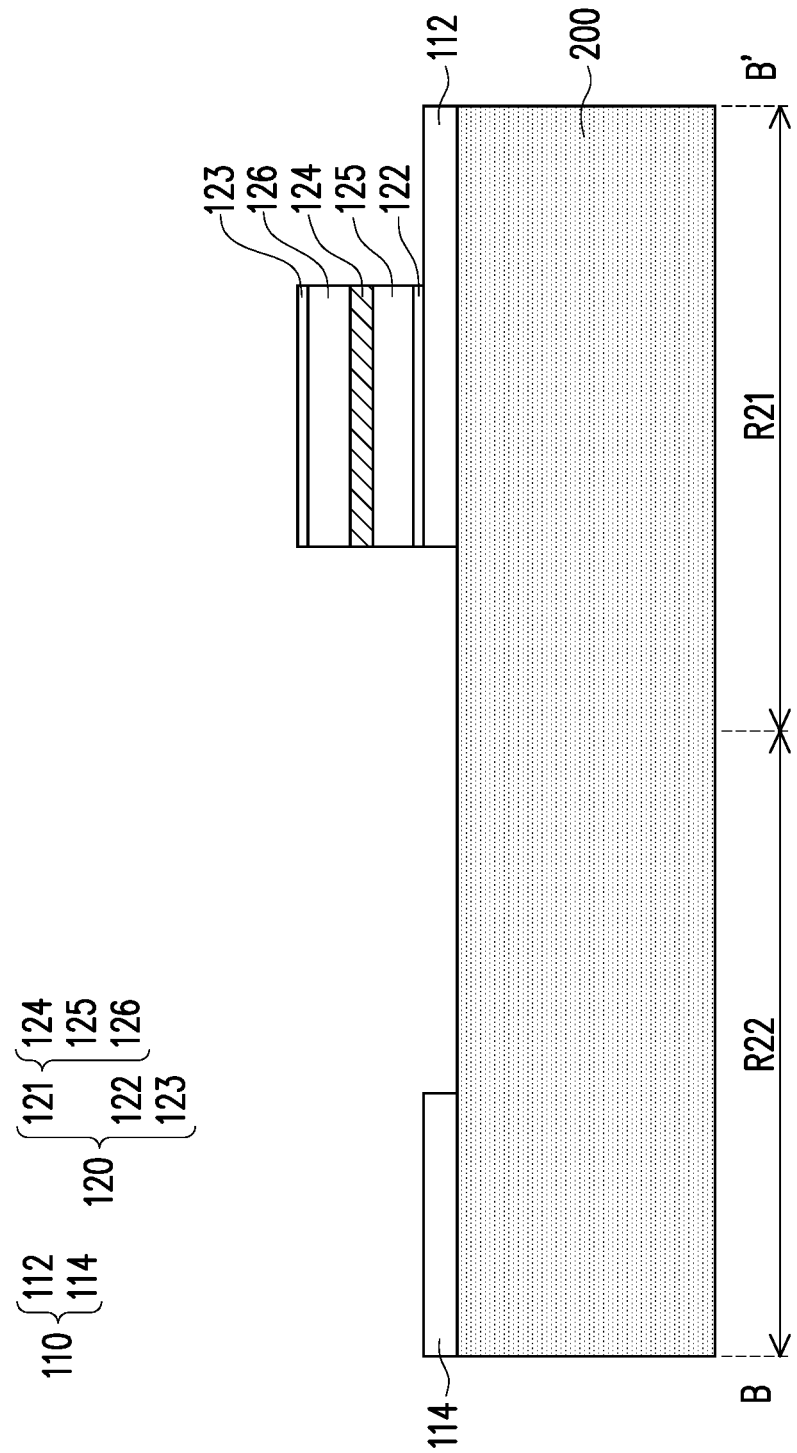

As shown in FIG. 4A, a substrate 200 is provided. Then, a patterned conductive layer 110 is formed on the substrate 200. According to some embodiments, the substrate 200 may have an original die region R21 and a repairing die region R22. Since the repairing light emitting diode die 140 of the pixel structure 20 is intended to be disposed on an element layer higher than an original light emitting diode die 120, the original die region R21 and the repairing die region R22 may not overlap, as shown in FIG. 4A, or may partially or completely overlap (i.e., a projection of one die completely overlaps or falls within a projection of the other die). Next, as shown in FIG. 4B, the original light emitting diode die 120 is provided, and the original light emitting diode die 120 is disposed on a first pattern 112 of the patterned conductive layer 110 by the first electrode 122.

Figure 4C:
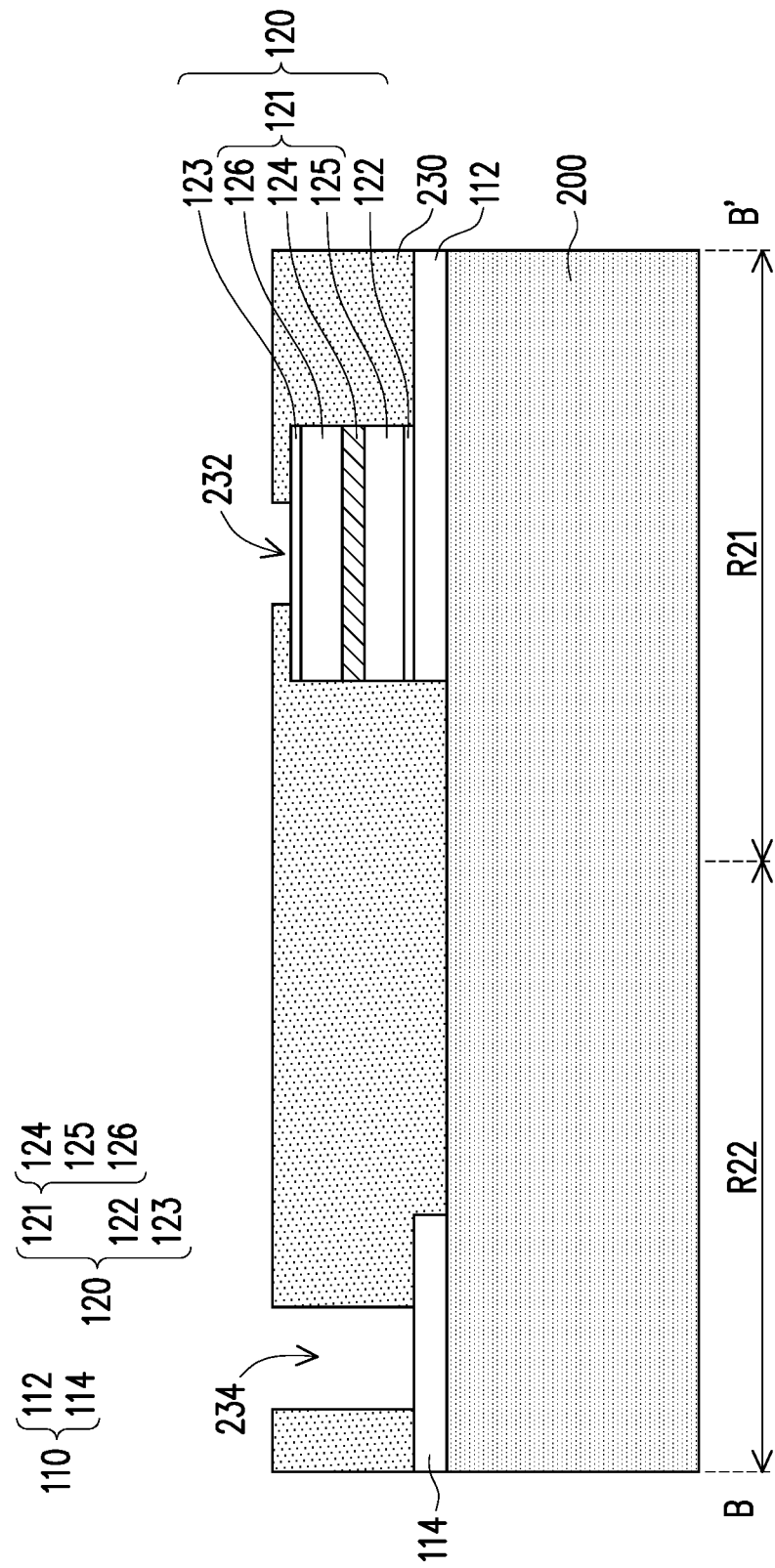

As shown in FIG. 4C, a dielectric protective layer 230 is formed to cover the original light emitting diode die 120. The dielectric protective layer 230 has an opening 232 to expose a second electrode 123. The dielectric protective layer 230 may further include a through hole 234 to expose the second pattern 114 of the patterned conductive layer 110. Specifically, the dielectric protective layer 230 is formed to be a planarization layer extending on the substrate 200 and covering the substrate 200, the patterned conductive layer 110 and the original light emitting diode die 120. The layer that covers the substrate 200, the patterned conductive layer 110 and the original light emitting diode die 120 and provides a flat surface may be formed at first, and then the opening 232 that exposes the second electrode 123 and the through hole 234 that exposes the second pattern 114 are formed.

Figure 4D:
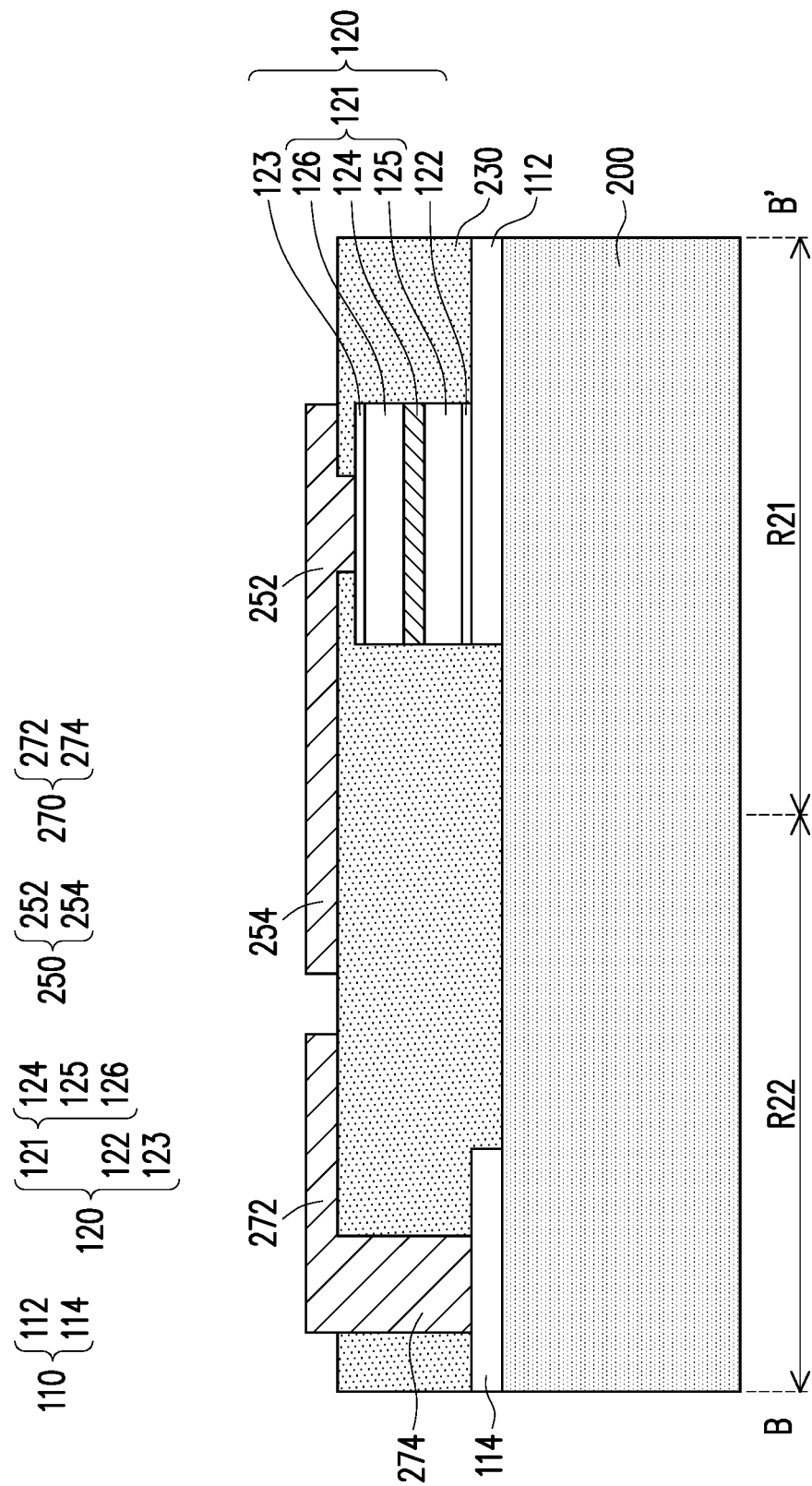

As shown in FIG. 4D, an extending conductor 250 is formed. The extending conductor 250 has a first portion 252 and a second portion 254. The second portion 254 of the extending conductor 250 is formed on the dielectric protective layer 230, and in particular, is formed on a portion of the dielectric protective layer 230 located in the repairing die region R22. Other features of the extending conductor 250 are similar to those of the extending conductor 150. As shown in FIG. 4D, a bonding conductor 270 is also formed. The bonding conductor 270 has a wiring portion 272 and a hole portion 274. The wiring portion 272 is located on the dielectric protective layer 230. The guide hole portion 274 is located in the through hole 234, and is connected to the second pattern 114 of the patterned conductive layer 110.

Figure 4E:
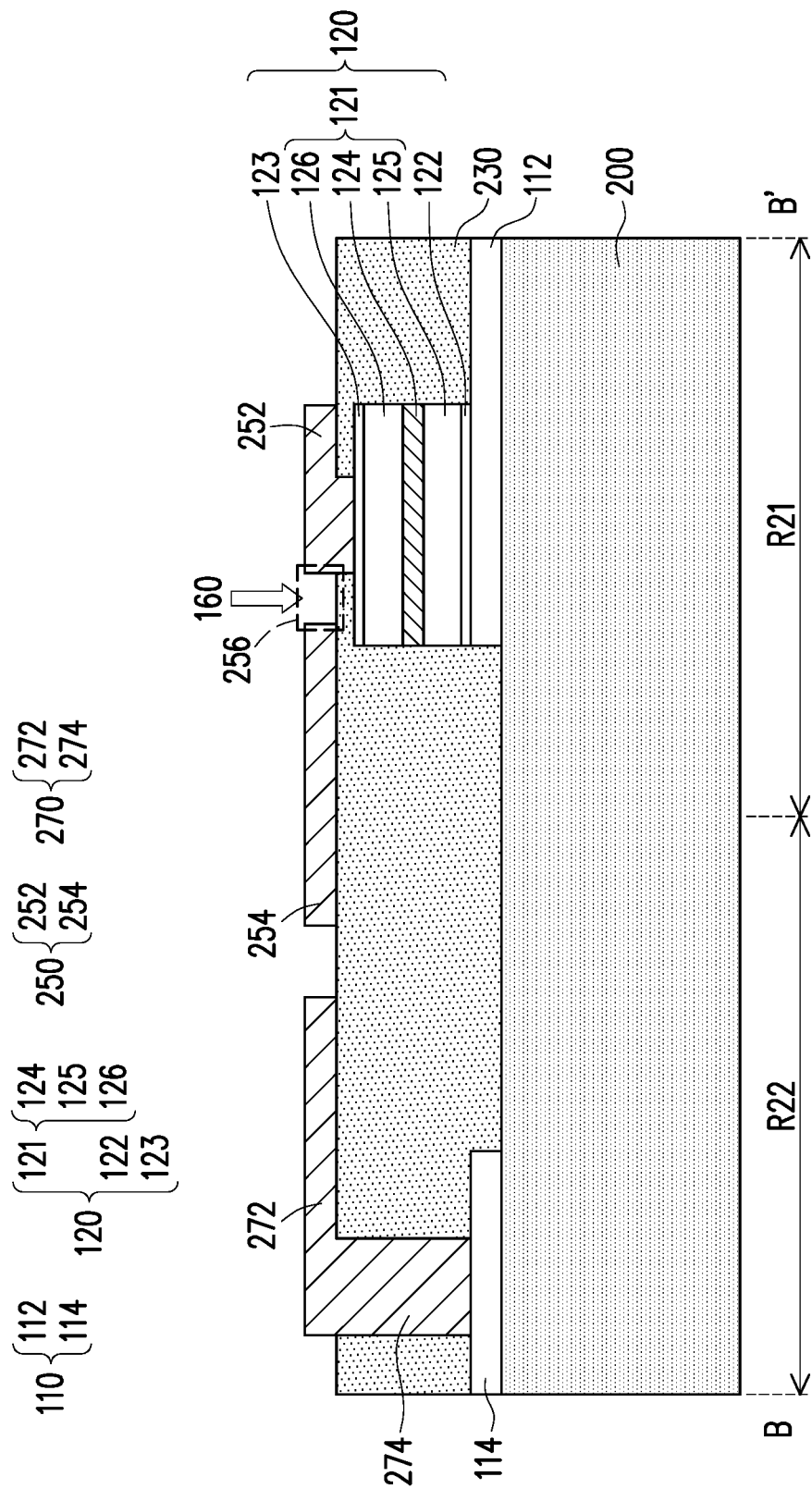

Next, the original light emitting diode die 120 may be detected to determine whether the original light emitting diode die 120 is normal. As shown in FIG. 4E, when the original light emitting diode die 120 is detected as abnormal, an electrical communication path of the first portion 252 corresponding to the extending conductor 250 may be cut off selectively, for example, cutting off the first portion 252 and the second portion 254. Laser cutting 160 may be performed. In this case, a cut-off region 256 of the extending conductor 250 may be burnt due to the laser cutting.

Figure 4F:
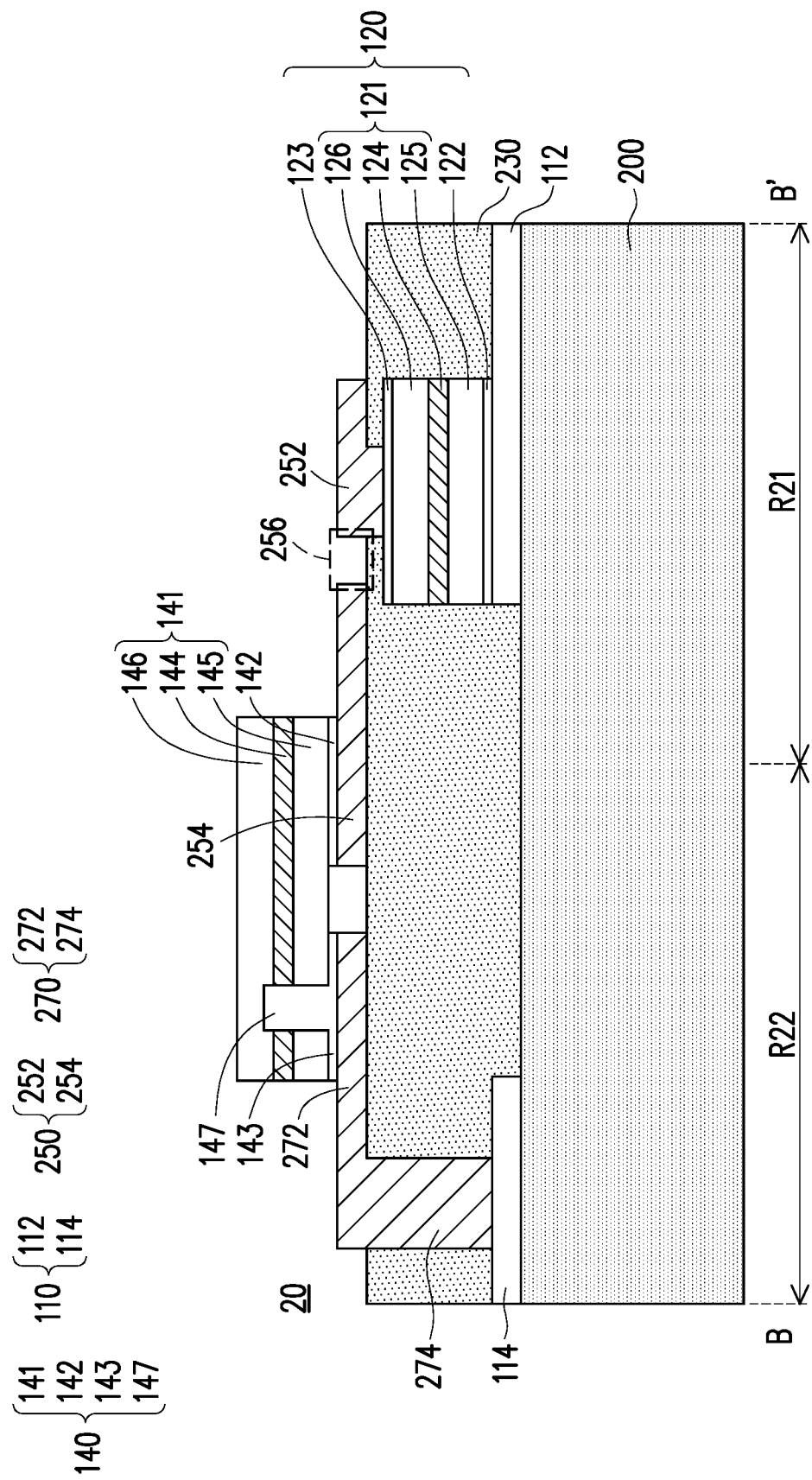

As shown in FIG. 4F, if the original light emitting diode die 120 is detected as abnormal, the repairing light emitting diode die 140 is disposed. According to some embodiments, a third electrode 142 of the repairing light emitting diode die 140 may be disposed on the second portion 254 of the extending conductor 250, and a fourth electrode 143 is disposed on the wiring portion 272 of the bonding conductor 270. In this way, the repairing light emitting diode die 140 may be further electrically connected to the outside.

Figure 5A:
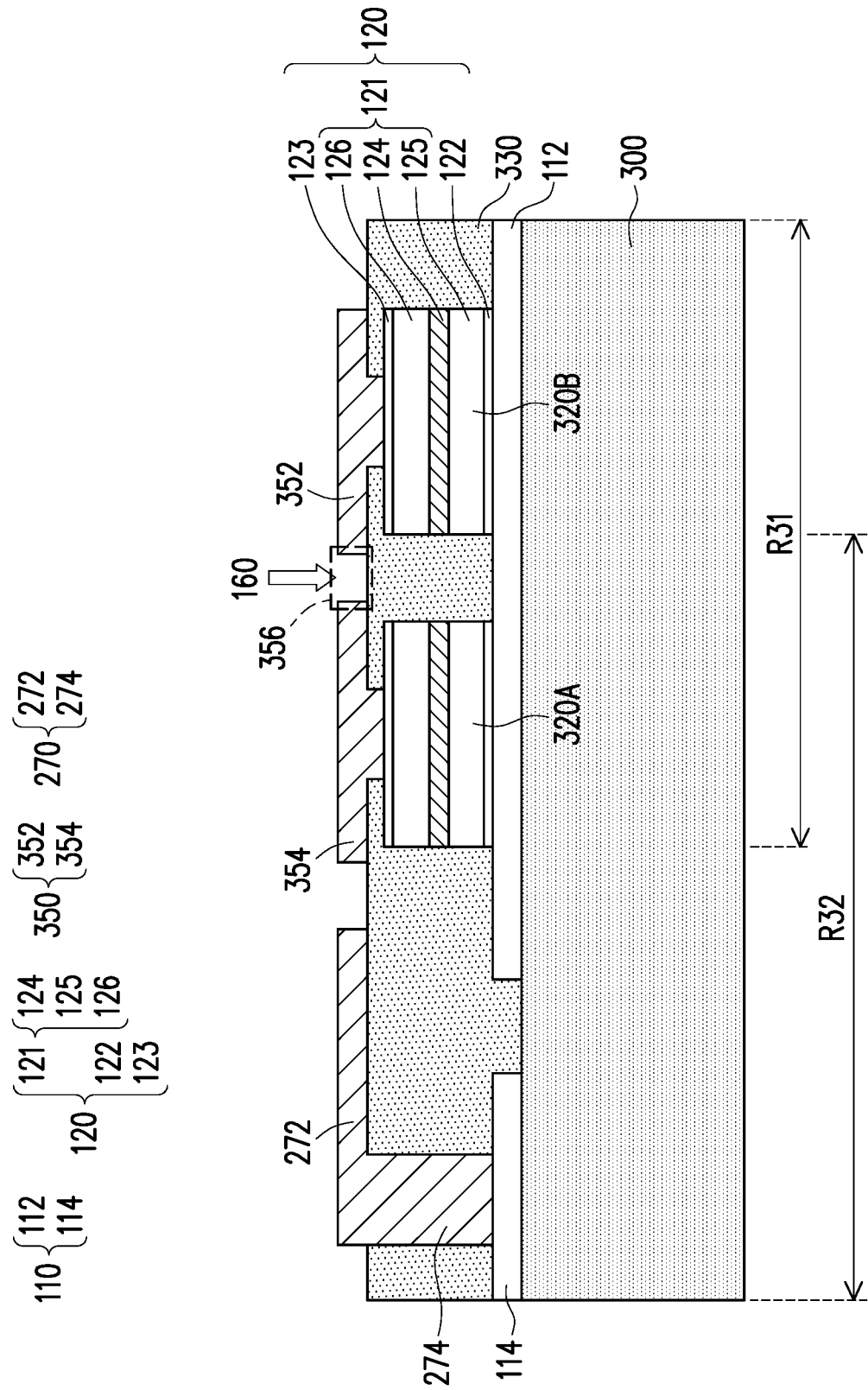
FIG. 5A to FIG. 5B are schematic diagrams of all stages of a manufacturing method of another exemplary pixel structure.
Figure 5B:
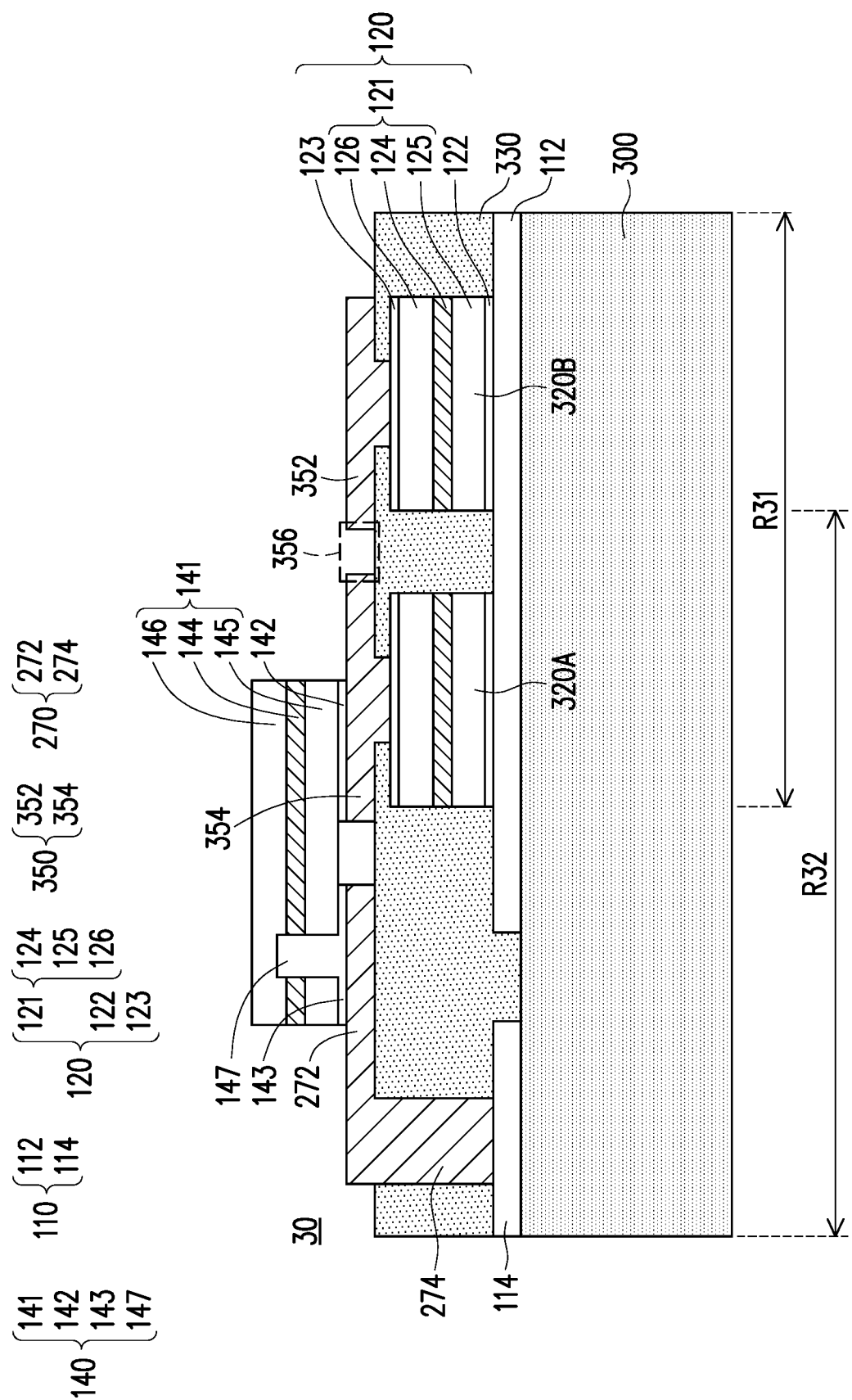

Referring to FIG. 5A to FIG. 5B, a manufacturing method of a pixel structure 30 according to an embodiment is illustrated. Features, details and advantages in the manufacturing method of the pixel structure 30, which are the same as those in the manufacturing method of the pixel structure 20 in FIG. 4A to FIG. 4F, are omitted here.

Referring to FIG. 5A, original light emitting diode dies 320A and 320B are detected to determine whether the original light emitting diode dies 320A and 320B are normal. As shown in FIG. 5A, if the original light emitting diode die 320B is detected as abnormal, an electrical communication path of a first portion 352 of an extending conductor 350 may be cut off selectively. For example, as shown in FIG. 5A, a cut-off region 356 of the extending conductor 350 may be located on the first portion 352. The cut-off region 356 is located on the first portion 352 between the original light emitting diode dies 320A and 320B, so that the normal original light emitting diode die 320A still maintains an electrical communication path, and a repairing light emitting diode die 140 will replace the original light emitting diode die 320B and be electrically connected to the original light emitting diode die 320A. Laser cutting 160 may be performed. In this case, the cut-off region 356 of the extending conductor 350 may be burnt due to the laser cutting. As shown in FIG. 5B, if the original light emitting diode die 320B is detected as abnormal, the repairing light emitting diode die 140 is disposed. The color of light emitted by the repairing light emitting diode die 140 is the same as that of the original light emitting diode dies 320A and 320B.

Now referring to FIG. 6, an exemplary display 1 is illustrated. The display 1 includes a plurality of pixel structures P. The pixel structures P are configured into an array. According to the display 1 of the embodiment, the pixel structures P include original light emitting diode dies that are normal, and original light emitting diode dies that are abnormal and repaired according to the foregoing embodiment. That is, at least one of the pixel structures P, for example a pixel structure P1, is the pixel structure according to the foregoing embodiment, such as the pixel structure 10, 20, or 30. At least the other one of the pixel structures P, for example a pixel structure P2, is not repaired, and therefore does not include the repairing light emitting diode die 140 of the pixel structure of the foregoing embodiment. Therefore, a total number of original light emitting diode dies of the pixel structures P is greater than a total number of repairing light emitting diode dies. Since only the pixel structures P with the abnormal light emitting diode dies are repaired, the number of the repairing light emitting diode dies 140 can be reduced.

Based on the above, defective pixels may be simply and effectively repaired after the original light emitting diode dies are packaged by using the pixel structure and the manufacturing method thereof according to the embodiments. Furthermore, the display having the pixel structures may still keep a desired display effect. In addition, the consumption of the repairing light emitting diode dies can also be reduced.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. A pixel structure, comprising:
    an original light emitting diode die, comprising a first epitaxial layer, a first electrode and a second electrode, the first electrode and the second electrode being disposed at opposite sides of the first epitaxial layer;
    a repairing light emitting diode die, a color of light emitted by the repairing light emitting diode die being the same as a color of light emitted by the original light emitting diode die, wherein the repairing light emitting diode die comprises a second epitaxial layer, a third electrode and a fourth electrode, and the third electrode and the fourth electrode are disposed at a same side of the second epitaxial layer and in direct contact with the second epitaxial layer; and
    an extending conductor, comprising a first portion and a second portion, the first portion being electrically connected to the second electrode of the original light emitting diode die, and the second portion being electrically connected to the third electrode of the repairing light emitting diode die,
    wherein the extending conductor further comprises a cut-off region, and the cut-off region is located in the first portion or between the first portion and the second portion.

2. The pixel structure according to claim 1, further comprising:
    a substrate;
    a patterned conductive layer, disposed on the substrate and comprising a first pattern and a second pattern, wherein the original light emitting diode die is disposed on the first pattern of the patterned conductive layer by the first electrode; and
    a dielectric protective layer, covering the original light emitting diode die and comprising an opening, the opening exposing the second electrode,
    wherein the extending conductor is at least partially disposed on the dielectric protective layer, and the first portion of the extending conductor is connected to the second electrode of the original light emitting diode die through the opening, and
    wherein the third electrode of the repairing light emitting diode die is disposed on the second portion of the extending conductor, and the fourth electrode is connected to the second pattern of the patterned conductive layer.

3. The pixel structure according to claim 2, wherein the dielectric protective layer is disposed on the original light emitting diode die.

4. The pixel structure according to claim 3, wherein the second portion of the extending conductor is disposed on the substrate, and the repairing light emitting diode die is disposed on the substrate through the second portion of the extending conductor and the second pattern of the patterned conductive layer.

5. The pixel structure according to claim 2, wherein a top surface of the dielectric protective layer is higher than a top surface of the original light emitting diode die, and the repairing light emitting diode die is located on the top surface of the dielectric protective layer.

6. The pixel structure according to claim 2, wherein the dielectric protective layer extends on the substrate and covers the substrate, the patterned conductive layer and the original light emitting diode die.

7. The pixel structure according to claim 6, wherein the second portion of the extending conductor is horizontally disposed on the dielectric protective layer, and the pixel structure further comprises:
    a bonding conductor, comprising a wiring portion and a guide hole portion, the wiring portion being disposed on the dielectric protective layer, and the guide hole portion passing through the dielectric protective layer and being connected to the second pattern of the patterned conductive layer,
    wherein the repairing light emitting diode die is disposed on the dielectric protective layer through the second portion of the extending conductor and the wiring portion of the bonding conductor.

8. The pixel structure according to claim 1, wherein a plurality of the original light emitting diode dies are provided, and the first portion of the extending conductor is electrically connected to the second electrodes of the plurality of original light emitting diode dies.

9. The pixel structure according to claim 1, wherein the original light emitting diode die and the repairing light emitting diode die have light emitting regions having a same area.

10. A display, comprising:
a plurality of pixel structures, configured into an array, wherein at least one of the pixel structures comprises:
an original light emitting diode die, comprising a first epitaxial layer, a first electrode and a second electrode, the first electrode and the second electrode being disposed at opposite sides of the first epitaxial layer;
a repairing light emitting diode die, a color of light emitted by the repairing light emitting diode die being the same as a color of light emitted by the original light emitting diode die, wherein the repairing light emitting diode die comprises a second epitaxial layer, a third electrode and a fourth electrode, and the third electrode and the fourth electrode are disposed at a same side of the second epitaxial layer and in direct contact with the second epitaxial layer; and
an extending conductor, comprising a first portion and a second portion, the first portion being electrically connected to the second electrode of the original light emitting diode die, and the second portion being electrically connected to the third electrode of the repairing light emitting diode die,
wherein the extending conductor further comprises a cut-off region, and the cut-off region is located in the first portion or between the first portion and the second portion.

11. The display according to claim 10, wherein a total number of the original light emitting diode dies of the pixel structures is greater than a total number of the repairing light emitting diode dies.

* * * * *